(12) United States Patent
Xue

(10) Patent No.: US 10,923,529 B2
(45) Date of Patent: Feb. 16, 2021

(54) DISPLAY SUBSTRATE, METHOD FOR MANUFACTURING DISPLAY SUBSTRATE, AND DISPLAY DEVICE

(71) Applicant: BOE TECHNOLOGY GROUP CO., LTD., Beijing (CN)

(72) Inventor: Dapeng Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/556,108

(22) Filed: Aug. 29, 2019

(65) Prior Publication Data

US 2020/0168661 A1    May 28, 2020

(30) Foreign Application Priority Data

Nov. 22, 2018  (CN) .......................... 2018 1 1398142

(51) Int. Cl.
*H01L 27/15*   (2006.01)
*H01L 27/12*   (2006.01)

(52) U.S. Cl.
CPC ........ *H01L 27/156* (2013.01); *H01L 27/1218* (2013.01)

(58) Field of Classification Search
None
See application file for complete search history.

(56) References Cited

U.S. PATENT DOCUMENTS

| | | | |
|---|---|---|---|
| 2012/0001200 A1* | 1/2012 | Ikoshi | ............... H01L 23/295 257/77 |
| 2015/0014716 A1 | 1/2015 | von Malm | |
| 2015/0187991 A1* | 7/2015 | McGroddy | ............. H01L 33/14 257/13 |
| 2017/0170248 A1 | 6/2017 | Sato | |
| 2018/0212051 A1* | 7/2018 | Wu | ..................... H01L 27/0218 |
| 2018/0247584 A1* | 8/2018 | Chen | ........................ G02B 5/20 |
| 2018/0277591 A1* | 9/2018 | Wu | ........................ H01L 33/60 |
| 2018/0315775 A1 | 11/2018 | He et al. | |
| 2018/0336839 A1* | 11/2018 | Chen | ..................... H01L 33/00 |
| 2019/0189487 A1* | 6/2019 | Ahn | ..................... H01L 21/6838 |

FOREIGN PATENT DOCUMENTS

| | | |
|---|---|---|
| CN | 106206611 A | 12/2016 |
| CN | 106486490 A | 3/2017 |
| CN | 106920818 A | 7/2017 |
| CN | 107464822 A | 12/2017 |
| JP | 2007288078 A | 11/2007 |

OTHER PUBLICATIONS

First Chinese Office Action dated Mar. 27, 2020, received for corresponding Chinese Application No. 201811398142.2, 19 pages.

* cited by examiner

*Primary Examiner* — Van N Chow
(74) *Attorney, Agent, or Firm* — Kinney & Lange, P.A.

(57) ABSTRACT

A display substrate, a method of manufacturing the same, and a display device are disclosed. The display substrate includes a driving substrate and a micro LED chip, wherein the micro LED chip includes a main body and an electrode pin, a TFT is arranged on the driving substrate, the micro LED chip is coupled to the TFT, and the display substrate further includes: a heat dissipation structure arranged between the micro LED chip and the TFT, wherein the heat dissipation structure is electrically coupled to the electrode pin of the micro LED chip.

14 Claims, 1 Drawing Sheet

DISPLAY SUBSTRATE, METHOD FOR MANUFACTURING DISPLAY SUBSTRATE, AND DISPLAY DEVICE

CROSS-REFERENCE TO RELATED APPLICATIONS

The present application claims a priority of Chinese Patent Application No. 201811398142.2 filed in China on Nov. 22, 2018, the disclosure of which is incorporated herein by reference in its entirety.

TECHNICAL FIELD

The present disclosure relates to the field of display technologies, and in particular to a display substrate and a method for manufacturing the same, and a display device.

BACKGROUND

A Light Emitting Diode (LED) is a kind of semiconductor diode, it is a photoelectric element that emits light according to unidirectional conductivity of a PN junction of a semiconductor. The LED is a lighting element widely used in worldwide markets at present, it has advantages of small size, high brightness, low power consumption, low heat generation, long service life, being environmentally friendly, etc., and it has a variety of luminous colors, which is popular in the market.

Micro LED is a product of a technology of miniaturization and matrix of LED chips. It refers to integration of an array of micro LED chips with high density and small size on one chip, each of the micro LED chips can be addressed and driven separately to light up, and pixel distance between two adjacent micro LED chips can be reduced from millimeter level to micrometer level, so as to improve display quality, and at the same time, it also has advantages of energy saving, high efficiency, high resolution, small size, and being light and thin, etc. Millions of LED chips need to be embedded within a size range of a display panel, an epitaxial structure of the micro LED chip usually needs to grow on a substrate, such as a sapphire substrate, and then transferred onto a driving substrate after being cut and peeled off.

In the related art, when the LED is transferred, the temperature of the transfer is generally in a range from 250° C. to 300° C., and due to existence of transfer pressure, a Thin Film Transistor (TFT) on the driving substrate is adversely affected by high pressure and high temperature, which will lead to rupture of a layer of the TFT and drift of characteristics of the TFT, thereby seriously affecting display quality of the display panel in an adverse manner.

SUMMARY

A technical problem to be solved by the present disclosure is to provide a display substrate, a method for manufacturing the same, and a display device.

To solve the above technical problem, the embodiments of the present disclosure provide the following technical solutions:

In one aspect, a display substrate is provided, including a driving substrate and a micro LED chip arranged on the driving substrate, wherein the micro LED chip includes a main body and an electrode pin, a TFT is arranged on the driving substrate, the micro LED chip is coupled to the TFT. The display substrate further includes: a heat dissipation structure arranged between the micro LED chip and the TFT, wherein the heat dissipation structure is electrically coupled to the electrode pin of the micro LED chip.

In an embodiment of the present disclosure, a side of the heat dissipation structure proximate to a base substrate of the driving substrate is in direct contact with an interlayer insulating layer of the TFT, and a side of the heat dissipation structure distal to the base substrate is in direct contact with a connection pattern, and the connection pattern is further in direct contact with the electrode pin.

In an embodiment of the present disclosure, the display substrate further includes: a pressure release structure arranged between the micro LED chip and the TFT;

In an embodiment of the present disclosure, the heat dissipation structure and a source electrode and a drain electrode of the TFT are arranged in a same layer and made of a same material.

In an embodiment of the present disclosure, a planarization layer and a passivation layer are arranged between the micro LED chip and the TFT, and the pressure release structure is a via hole penetrating through the planarization layer.

In an embodiment of the present disclosure, a thickness of the heat dissipation structure is greater than 5,000 angstroms.

In an embodiment of the present disclosure, the driving substrate includes a base substrate and a buffer layer arranged on the base substrate, and the TFT is arranged on a side of the buffer layer distal to the base substrate.

The embodiments of the present disclosure also provide a display device including the display substrate as described above.

The embodiments of the present disclosure also provide a method for manufacturing a display substrate, including: forming a TFT on a driving substrate, and transferring a micro LED chip onto the driving substrate to enable the micro LED chip to connect to the TFT, wherein the micro LED chip including a main body and a driving electrode configured to drive the main body to emit light. The method further includes: prior to transferring the micro LED chip onto the driving substrate, forming a heat dissipation structure between a region where the micro LED chip is to be transferred and the TFT, wherein the heat dissipation structure is electrically coupled to an electrode pin.

In an embodiment of the present disclosure, the method for manufacturing the display substrate further includes: prior to transferring the micro LED chip onto the driving substrate, forming a pressure release structure between the region where the micro LED chip is to be transferred and the TFT.

In an embodiment of the present disclosure, the method for manufacturing the display substrate further includes: forming a source electrode and a drain electrode of the TFT and the heat dissipation structure through a single patterning process.

In an embodiment of the present disclosure, forming the pressure release structure includes: subjecting a planarization layer between the region where the micro LED chip is to be transferred and the TFT to a patterning process, to form a via hole penetrating through the planarization layer.

In an embodiment of the present disclosure, a side of the heat dissipation structure proximate to a base substrate of the driving substrate is in direct contact with an interlayer insulating layer of the TFT, and a side of the heat dissipation structure distal to the base substrate is in direct contact with a connection pattern, and the connection pattern is further in direct contact with the electrode pin.

In an embodiment of the present disclosure, the driving substrate includes a base substrate and a buffer layer arranged on the base substrate, and the TFT is arranged on a side of the buffer layer distal to the base substrate.

DETAILED DESCRIPTION

Figure 1:
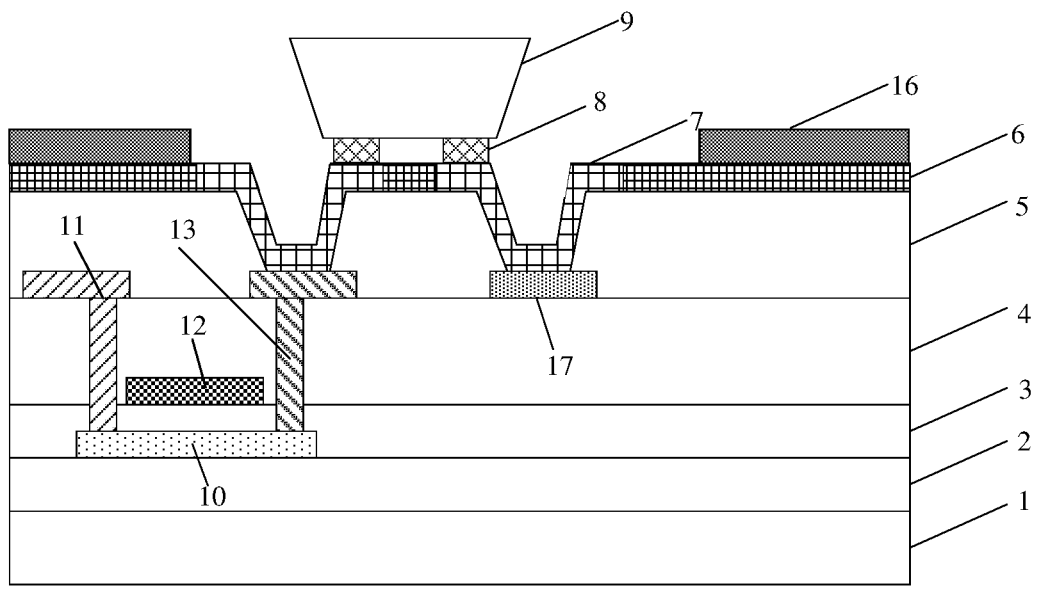
FIG. 1 is a schematic view of a display substrate in the related art.

In order to make technical problems, technical solutions and advantages to be solved by the embodiments of the present disclosure more clear, detailed description will be made below in conjunction with the accompanying drawings and specific embodiments.

In view of the problem that, in the related art, when a LED is transferred, a TFT on a driving substrate is adversely affected by high pressure and high temperature, which will lead to rupture of a layer of the TFT and drift of characteristics of the TFT, thereby seriously affecting display quality of a display panel in an adverse manner, the embodiments of the present disclosure provide a display substrate, a method for manufacturing the display substrate, and a display device, which can ensure display quality of the display substrate.

A display substrate is provided by the embodiments of the present disclosure, including a driving substrate and a micro LED chip, wherein the micro LED chip includes a main body and an electrode pin, a TFT is arranged on the driving substrate, the micro LED chip is coupled to the TFT. The display substrate further includes: a heat dissipation structure arranged between the micro LED chip and the TFT, wherein the heat dissipation structure is electrically coupled to the electrode pin of the micro LED chip.

In this embodiment, the heat dissipation structure is arranged between the micro LED chip and the TFT, and the heat dissipation structure is electrically coupled to the electrode pin of the micro LED chip. By means of the heat dissipation structure, heat generated during the transfer can be dissipated, adverse influence of high temperature on the TFT during the transfer can be reduced, and performance of the TFT can be guaranteed, thereby ensuring the display quality of the display substrate.

In addition, a side of the heat dissipation structure proximate to the base substrate is in direct contact with an interlayer insulating layer of the TFT, and a side of the heat dissipation structure distal to the base substrate is in direct contact with a connection pattern, and the connection pattern is further in direct contact with the electrode pin.

In addition, the display substrate further includes a pressure release structure arranged between the micro LED chip and the TFT.

In this embodiment, the pressure release structure is arranged between the micro LED chip and the TFT. By means of the pressure release structure, pressure generated during transfer can be released, adverse influence of the pressure on the TFT can be reduced, and the performance of the TFT can be guaranteed, thereby ensuring the display quality of the display substrate.

In addition, the heat dissipation structure and a source electrode and a drain electrode of the TFT are arranged in a same layer and made of a same material. In this way, the heat dissipation structure and the source electrode and the drain electrode of the TFT can be formed simultaneously through a single patterning process, and the heat dissipation structure can be formed without an additional patterning process. By means of the heat dissipation structure, the heat generated during the transfer can be dissipated, adverse influence of high temperature on the TFT during the transfer can be reduced, and the performance of the TFT can be guaranteed, thereby ensuring the display quality of the display substrate.

Specifically, a planarization layer and a passivation layer are arranged between the micro LED chip and the TFT, and the pressure release structure is a via hole penetrating through the planarization layer.

In addition, in order to ensure that the heat generated during transfer can be effectively dissipated by the heat dissipation structure, a thickness of the heat dissipation structure may be greater than 5,000 angstroms.

In addition, the driving substrate includes a base substrate and a buffer layer arranged on the base substrate, and the micro LED chip, the TFT are arranged on a side of the buffer layer distal to the base substrate.

The embodiments of the present disclosure also provide a display device including the display substrate as described above. The display device may be any product or component having a display function, such as a television, a display, a digital photo frame, a mobile phone, a tablet computer, etc., wherein the display device may further include a flexible circuit board, a printed circuit board, and a backboard.

The embodiments of the present disclosure also provide a method for manufacturing a display substrate, including: forming a TFT on a driving substrate, and transferring a micro LED chip onto the driving substrate to enable the micro LED chip to connect to the TFT, wherein the micro LED chip includes a main body and a driving electrode configured to drive the main body to emit light. The manufacturing method further includes: prior to transferring the micro LED chip onto the driving substrate, forming a heat dissipation structure between a region where the micro LED chip is to be transferred and the TFT, wherein the heat dissipation structure is electrically coupled to an electrode pin.

In this embodiment, the heat dissipation structure is arranged between the micro LED chip and the TFT, and the heat dissipation structure is electrically coupled to the electrode pin of the micro LED chip. By means of the heat dissipation structure, the heat generated during the transfer can be dissipated, adverse influence of high temperature on the TFT during the transfer can be reduced, and performance of the TFT can be guaranteed, thereby ensuring the display quality of the display substrate.

In addition, the manufacturing method further includes: prior to transferring the micro LED chip onto the driving substrate, forming a pressure release structure between the region where the micro LED chip is to be transferred and the TFT.

In this embodiment, the pressure release structure is arranged between the micro LED chip and the TFT. By means of the pressure release structure, pressure generated during transfer can be released, adverse influence of the pressure on the TFT can be reduced, and the performance of the TFT can be guaranteed, thereby ensuring the display quality of the display substrate.

In addition, forming the heat dissipation structure includes: the source electrode and the drain electrode of the TFT, and the heat dissipation structure are formed through the single patterning process. In this way, the heat dissipation structure can be formed without the additional patterning process, the heat generated during the transfer can be dissipated, the adverse influence of high temperature on the TFT during the transfer can be reduced, and the performance of the TFT can be guaranteed, thereby ensuring the display quality of the display substrate.

Specifically, forming the pressure release structure includes: subjecting a planarization layer between the region where the micro LED chip is to be transferred and the TFT to a patterning process, to form a via hole penetrating through the planarization layer.

Technical solutions of the present disclosure will be further described below with reference to the accompanying drawings and specific embodiments:

FIG. 1 is a schematic view of a display substrate in the related art. As shown in FIG. 1, the display substrate includes a TFT, electrode pins 8 and a micro LED chip arranged on the base substrate 1, wherein the TFT includes a gate insulation layer 3, an interlayer insulating layer 4, an active layer 10, a source electrode 11, a gate electrode 12, and a drain electrode 13, and the micro LED chip includes a main body 9 and the electrode pins 8. The electrode pins 8 may be an anode and a cathode that are coupled to the main body 9, and one of the electrode pins 8 being the anode is coupled to the drain electrode 13 through a connection pattern 7. The drain electrode 13 is configured to receive a signal, and transmit a signal to the anode of the LED through the drain electrode when the TFT is turned on, and an electrode 17 may transmit a signal to the cathode of the LED.

Since millions of LED chips with each of a size of less than 100 μm need to be embedded within a size range of a display panel, an epitaxial structure of the micro LED chip usually needs to grow on a substrate, such as a sapphire substrate, and then transferred onto the driving substrate after being cut and peeled off.

In the related art, when the LED is transferred, the temperature of the transfer is generally in a range from 250° C. to 300° C., and due to existence of transfer pressure, a TFT on the driving substrate is adversely affected by high pressure and high temperature, which will lead to rupture of a layer of the TFT and drift of characteristics of the TFT, thereby seriously affecting display quality of the LEDs in an adverse manner.

Figure 2:
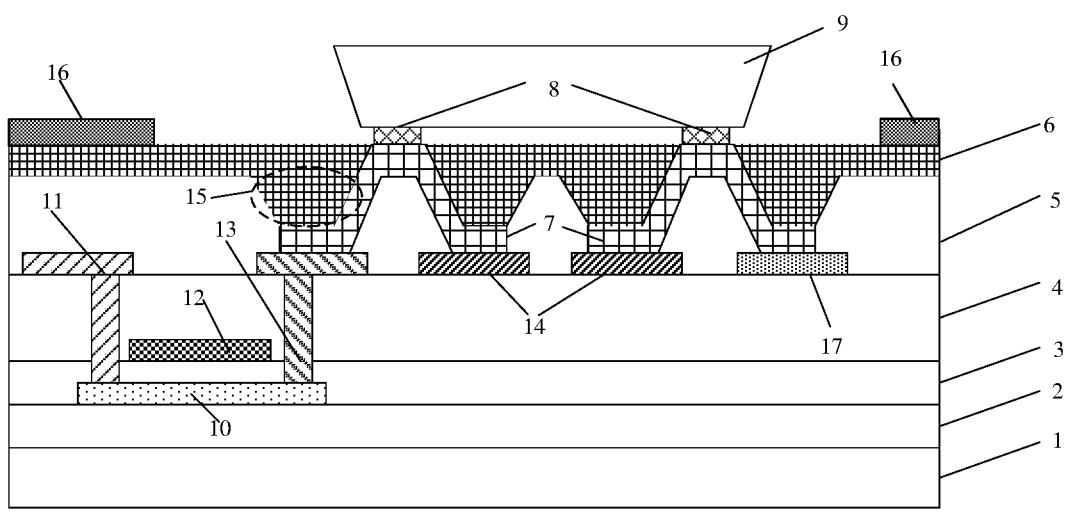
FIG. 2 is a schematic view of a display substrate according to an embodiment of the present disclosure.

In order to solve the above problem, as shown in FIG. 2, the embodiments of the present disclosure provides a display substrate, and a heat dissipation structure 14 and a via hole 15 are provided between the micro LED chip and the TFT (as shown in FIG. 2, the via hole 15 is a via hole formed in the planarization layer 5), wherein the heat dissipation structure 14 can dissipate the heat generated during the transfer, and the adverse influence of the high temperature on the TFT device during the transfer can be reduced, and the via hole 15 can release the pressure generated during the transfer, so that the adverse influence of the transfer pressure on the TFT device is reduced, and the performance of the TFT is guaranteed, thereby ensuring the display quality of the display substrate.

The method for manufacturing the display substrate of this embodiment specifically includes the following steps.

Step 1: providing the substrate 1, and forming the buffer layer 2 on the substrate 1.

The base substrate 1 may be a glass substrate or a quartz substrate. The buffer layer 2 is made of one or any combination of SiNx, SiO$_2$, and SiON, and is generally a laminated structure of SiNx/SiO$_2$ having a thickness of 2,000 to 5,000 angstroms.

Step 2: forming the active layer 10 on the buffer layer 2.

Specifically, a layer of a semiconductor material is deposited on the buffer layer 2, a layer of photoresist is coated on the semiconductor material, and the photoresist is exposed by using a mask to form a photoresist unreserved region and a photoresist reserved region, wherein the photoresist reserved region corresponds to a region where a pattern of the active layer 10 is located, and the photoresist unreserved region corresponds to a region other than the pattern of the active layer 10. After a development process, the photoresist in the photoresist unreserved region is completely removed, and a thickness of the photoresist in the photoresist reserved region remains unchanged. A semiconductor material in the photoresist unreserved region is completely removed by an etching process to form the pattern of the active layer 10, and then the remaining photoresist is removed.

Step 3: forming the gate insulation layer 3.

The gate insulation layer 3 is made of one or any combination of SiNx, SiO$_2$, and SiON, and is typically a laminated structure of SiNx/SiO$_2$ having a thickness of 1,000 to 2,000 angstroms.

Step 4, forming the gate electrode 12.

Specifically, a gate metal layer having a thickness of about 500 to 4,000 angstroms may be deposited on the gate insulation layer 3 by a sputtering process or a thermal evaporation process. The gate metal layer may be made of a metal such as Cu, Al, Ag, Mo, Cr, Nd, Ni, Mn, Ti, Ta, or W, or an alloy of these metals, and the gate metal layer may be a single layer structure or a multilayer structure such as Cu\Mo, Ti\Cu\Ti, Mo\Al\Mo or the like. A layer of photoresist is coated on the gate metal layer, and the photoresist is exposed by using a mask to form a photoresist unreserved region and a photoresist reserved region, wherein the photoresist reserved region corresponds to a region where a pattern of the gate electrode 12 is located, and the photoresist unreserved region corresponds to a region other than the above-mentioned pattern. After a development process, the photoresist in the photoresist unreserved region is completely removed, and a thickness of the photoresist in the photoresist reserved region remains unchanged. The gate electrode 12 in the photoresist unreserved region is completely removed by an etching process, and the remaining photoresist is removed to form the pattern of the gate electrode 12.

Step 5: forming the interlayer insulating layer 4.

The interlayer insulating layer 4 is made of one or any combination of SiNx, SiO$_2$, and SiON, and is typically a laminated structure of SiNx/SiO$_2$ having a thickness of 2,000 to 5,000 angstroms.

The interlayer insulating layer 4 and the gate insulation layer 3 are subjected to a patterning process to form a via hole exposing the active layer 10.

Step 6: forming the source electrode 11 and the drain electrode 13, the connection pattern 7, the heat dissipation structure 14, and the electrode 17.

Specifically, a source-drain metal layer having a thickness greater than 5000 angstroms may be deposited on the interlayer insulating layer 4 by a magnetron sputtering process, a thermal evaporation process or another film forming process. The source-drain metal layer may be made of a metal such as Cu, Al, Ag, Mo, Cr, Nd, Ni, Mn, Ti, Ta, or W, or an alloy of these metals, and the source-drain metal layer may be a single layer structure or a multilayer structure such as Cu\Mo, Ti\Cu\Ti, Mo\Al\Mo or the like. A layer of photoresist is coated on the source-drain metal layer, and the photoresist is exposed by using a mask to form a photoresist unreserved region and a photoresist reserved region, wherein the photoresist reserved region corresponds to the regions where patterns of the source electrode 11, the drain electrode 13, the connection pattern 7, the heat dissipation structure 14, and the electrode 17 are located, and the photoresist unreserved region corresponds to a region other than the above-mentioned pattern. After the development process, the photoresist in the photoresist unreserved region is completely removed, and the thickness of the photoresist in the photoresist reserved region remains unchanged. The source-drain metal layer in the photoresist unreserved region is completely removed by the etching process, and the remaining photoresist is removed to form the source electrode 11, the drain electrode 13, the connection pattern 7, the heat dissipation structure 14, and the electrode 17.

The source electrode 11 and the drain electrode 13 are coupled to the active layer 10, and the connection pattern 7 is configured to connect a drain electrode 13 to the heat dissipation structure 14, and the connection pattern 7 is further configured to connect the electrode 17 to the heat dissipation structure 14. When the heat dissipation structure 14 is made of a conductive material, it can also bear a portion of the pressure besides having the heat dissipation function.

Step 7: forming the planarization layer 5.

The planarization layer 5 is made of a resin material and has a thickness of generally more than 2 μm, and the via hole exposing the drain electrode 13, the connection pattern 7, and the heat dissipation structure 14 is formed through a patterning process.

Step 8, forming a connection pattern 7.

The connection pattern 7 is generally a laminated structure of three sub-layers of Indium Tin Oxide (ITO)/Ag/ITO, and has a thickness of 1,000 to 2,000 angstroms; so that the connection pattern 7 is overlapped on and coupled to the drain electrode 13, the electrode 17, and the heat dissipation structure 14.

Step 9: forming the passivation layer 6.

The passivation layer 6 is made of one or any combination of SiNx, SiO$_2$, and SiON, and is typically a laminated structure of SiNx/SiO$_2$ having a thickness of 1,000 to 2,000 angstroms so as to protect the connection pattern 7.

Step 10: forming a black matrix 16.

The black matrix 16 absorbs light obliquely below the main body 9, such that it can prevent adverse influence of the light on the performance of the TFT; and prevent crosstalk of the light between adjacent main bodies 9.

Step 11: transferring the micro LED chip.

One of the electrode pins 8 of the micro LED chip is coupled to one of the drain electrode 13 and the heat dissipation structure 14 through the connection pattern 7, and the other of the electrode pins 8 of the micro LED chip is coupled to the other of the electrode 17 and the heat dissipation structure 14 through the connection pattern 7, so that the heat dissipation structure 14 can dissipate the heat generated during the transfer, and the heat dissipation structure 14 can also bear a portion of the pressure when the display substrate is in operation, thereby optimizing the display quality of the display substrate. Moreover, as shown in FIG. 2, the upper surface of the passivation layer 6 is in direct contact with the main body 9, so that it can assist in supporting the main body 9.

In this embodiment, by forming a via hole between the TFT and the region where the micro LED chip is to be transferred, and forming the heat dissipation structure, during the transfer process, the heat transferred to the TFT can be reduced, the transfer pressure can be buffered (with the insulating layer below), and the adverse influence of the transfer temperature and the transfer pressure on the TFT can be reduced, thereby ensuring stability of characteristics of the TFT without the additional patterning process, and thus improving the production yield and the display quality of the LED display.

In the embodiments of various methods of the present disclosure, sequence numbers of steps cannot be used to limit sequence of the steps. Those of ordinary skill in the art may change the sequence of the steps without any creative effort, which also falls within the scope of the disclosure.

Unless otherwise defined, technical terms or scientific terms used in the present disclosure shall be of ordinary meaning as understood by those of ordinary skill in the art to which the disclosure belongs. The words "first", "second" and similar terms used in the present disclosure do not denote any order, quantity, or importance, but are used to distinguish different components. The word "including" or "comprising" or the like means that an element or an item preceding the word includes an element or an item listed after the word and its equivalent, without excluding other components or objects. The words "connecting" or "connected" or the like are not limited to physical or mechanical connections, but may include electrical connections, whether direct or indirect. The words "upper", "lower", "left", "right", etc. are only used to indicate relative positional relationship, and when the absolute position of the object to be described is changed, relative positional relationship may also be changed accordingly.

It will be understood that when an element such as a layer, a film, a region or a substrate is referred to as being "on" or "under" another element, the element may be directly on or under another element, or an intermediate element may be present between them.

The above are merely preferred embodiments of the present disclosure, and it should be noted that those skilled in the art can make various improvements and modifications without departing from principles of the present disclosure, and these improvements and modifications should also be considered as falling into the protection scope of the present disclosure.

What is claimed is:

1. A display substrate, comprising a driving substrate and a micro Light Emitting Diode (LED) chip, wherein the micro LED chip comprises a main body and an electrode pin, a Thin Film Transistor (TFT) is arranged on the driving substrate, the micro LED chip is coupled to the TFT, and the display substrate further comprises:
    a heat dissipation structure arranged between the micro LED chip and the TFT, wherein the heat dissipation structure is electrically coupled to the electrode pin of the micro LED chip, a second side of the heat dissipation structure distal to the base substrate is in direct physical contact with a connection pattern, the connection pattern is further in direct physical contact with the electrode pin, a planarization layer and a passivation layer, and the connection pattern is of a laminated structure of three sub-layers of Indium Tin Oxide (ITO)/Ag/ITO.

2. The display substrate according to claim 1, wherein a first side of the heat dissipation structure proximate to a base substrate is in direct contact with an interlayer insulating layer of the TFT.

3. The display substrate according to claim 1, further comprising:
    a pressure release structure arranged between the micro LED chip and the TFT.

4. The display substrate according to claim 3, wherein the planarization layer and the passivation layer are arranged between the micro LED chip and the TFT, and the pressure release structure is a via hole penetrating through the planarization layer.

5. The display substrate according to claim 1, wherein the heat dissipation structure and a source electrode and a drain electrode of the TFT are arranged in a same layer and made of a same material.

6. The display substrate according to claim 1, wherein a thickness of the heat dissipation structure is greater than 5,000 angstroms.

7. The display substrate according to claim 1, wherein the driving substrate comprises a base substrate and a buffer layer arranged on the base substrate, and the TFT is arranged on a side of the buffer layer distal to the base substrate.

8. A display device comprising the display substrate according to claim 1.

9. A method for manufacturing a display substrate, comprising:
   forming a TFT on a driving substrate, and transferring a micro LED chip onto the driving substrate to enable the micro LED chip to connect to the TFT, wherein the micro LED chip comprises a main body and a driving electrode configured to drive the main body to emit light,
   wherein the method further comprises:
   prior to transferring the micro LED chip onto the driving substrate, forming a heat dissipation structure between a region where the micro LED chip is to be transferred and the TFT, wherein the heat dissipation structure is electrically coupled to an electrode pin, wherein a second side of the heat dissipation structure distal to a base substrate is in direct physical contact with a connection pattern, the connection pattern is further in direct physical contact with the electrode pin, a planarization layer and a passivation layer, and the connection pattern is of a laminated structure of three sub-layers of ITO/Ag/ITO.

10. The method for manufacturing the display substrate according to claim 9, further comprising:
   prior to transferring the micro LED chip onto the driving substrate, forming a pressure release structure between the region where the micro LED chip is to be transferred and the TFT.

11. The method for manufacturing the display substrate according to claim 10, wherein forming the pressure release structure comprises:
   subjecting a planarization layer between the region where the micro LED chip is to be transferred and the TFT to a patterning process, to form a via hole penetrating through the planarization layer.

12. The method for manufacturing the display substrate according to claim 9, further comprising:
   forming a source electrode and a drain electrode of the TFT and the heat dissipation structure through a single patterning process.

13. The method for manufacturing the display substrate according to claim 9, wherein a side of the heat dissipation structure proximate to the base substrate is in direct contact with an interlayer insulating layer of the TFT.

14. The method for manufacturing the display substrate according to claim 9, wherein the driving substrate comprises a base substrate and a buffer layer arranged on the base substrate, and the TFT is arranged on a side of the buffer layer distal to the base substrate.

* * * * *